United States Patent [19]
Taniuchi et al.

[11] Patent Number: 5,326,936
[45] Date of Patent: Jul. 5, 1994

[54] MOUNTING DEVICE FOR MOUNTING AN ELECTRONIC DEVICE ON A SUBSTRATE BY THE SURFACE MOUNTING TECHNOLOGY

[75] Inventors: Kenjiro Taniuchi; Hideo Miyazawa; Kouji Ishikawa; Kouji Watanabe, all of Kawasaki, Japan

[73] Assignee: Fujitsu Limited, Kawasaki, Japan

[21] Appl. No.: 774,510

[22] Filed: Oct. 10, 1991

[30] Foreign Application Priority Data

Oct. 11, 1990 [JP] Japan ................. 2-272551

[51] Int. Cl.⁵ ............................. H05K 1/00
[52] U.S. Cl. ................. 174/260; 174/262; 174/263; 29/832
[58] Field of Search ............ 174/262, 263, 260; 29/832; 361/417, 419

[56] References Cited

U.S. PATENT DOCUMENTS

| | | |
|---|---|---|
| 4,142,286 | 3/1979 | Knuth et al. |
| 4,216,350 | 8/1980 | Reid ................... 174/250 |
| 5,019,944 | 5/1991 | Ishii et al. |
| 5,117,330 | 5/1992 | Miazaga |

OTHER PUBLICATIONS

"Pin and Solder Ring Loader", Cioffi, Jr., et al., IBM Technical Disclosure Bulletin, vol. 21, No. 7, Dec., 1978, pp. 2912-2913.

Primary Examiner—Leo P. Picard
Assistant Examiner—Cheryl R. Figlin
Attorney, Agent, or Firm—Nikaido, Marmelstein, Murray & Oram

[57] ABSTRACT

A mounting device for mounting an electronic device on a substrate is described. The electronic device has a plurality of interconnection pins for engagement with corresponding through-holes on the substrate for electric interconnection. The mounting device incorporates a plate member of an insulating material provided with a plurality of counter-bores on an upper major surface of the plate member in correspondence to the interconnection pins of the electronic device, a plurality of through-holes provided on the plate member in correspondence to each of the counter-bores in a concentric relationship to the counter-bore, and a plurality of solder rings provided on the plurality solder rings provided on the plurality of counter-bores.

15 Claims, 4 Drawing Sheets

FIG. 2(A)
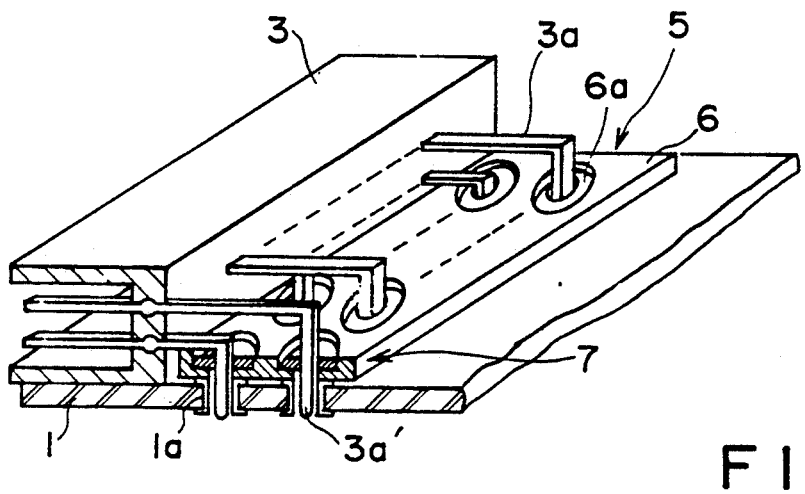
FIG. 2(B)
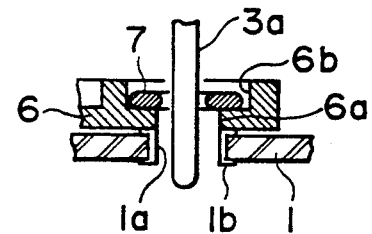
FIG. 3(A)  FIG. 3(B)  FIG. 3(C)
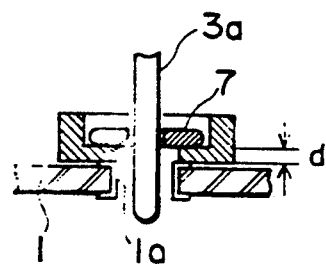 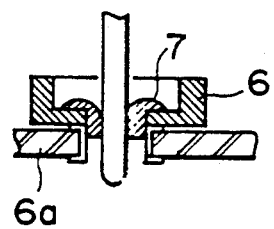 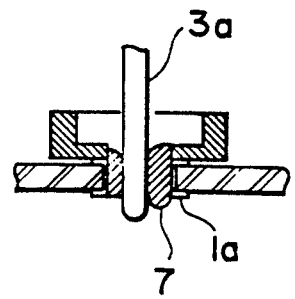

MOUNTING DEVICE FOR MOUNTING AN ELECTRONIC DEVICE ON A SUBSTRATE BY THE SURFACE MOUNTING TECHNOLOGY

BACKGROUND OF THE INVENTION

The present invention generally relates to electronic devices and more particularly to a mounting device or bracket used for mounting an electronic device on a substrate such as a printed circuit board by surface mounting technology (SMT).

Printed circuit boards are used for supporting electronic devices and for providing interconnections between the devices. The printed circuit board carries thereon a conductor pattern corresponding to the desired wiring or interconnection.

In mounting the integrated circuits or other electronic devices on the printed circuit board, a surface mounting technology is used. In the surface mounting technology, devices having pins provided with a flattened bottom surface as shown in FIG. 1 are used. See devices 2a-2c of FIG. 1. More specifically, a solder pattern is provided on a printed circuit board 1 in correspondence to the pins of the devices to be mounted, and the devices 2a-2c are placed on the surface of the printed circuit board 1 such that each pin of the device contacts with the corresponding solder pattern on the printed circuit board 1. After the devices are thus placed, the printed circuit board 1 is passed through a heating fixture together with the electronic devices placed thereon. Thereby, the solder located under the pin causes a melting called fellow, and the pins are fixed firmly on the solder pattern upon exiting from the heating fixture. This surface mounting technology is easy to implement and reduces the cost of the electronic apparatus.

Meanwhile, there are electronic devices of another type that have interconnection pins that lack the flattened lower surface for surface mounting technology. These pins are adapted to be inserted into through-holes provided on the printed circuit board 1. For example, a connector 3 has a number of pins 3a that are adapted to be accepted by corresponding through-holes 1a on the printed circuit board 1. Further, there are integrated circuits having the PGA structure as shown by an integrated circuit 4. The integrated circuit 4 has a number of interconnection pins 4a arranged in rows and columns at the bottom surface of the body of the integrated circuit, and the integrated circuit 4 is mounted on the printed circuit board 1 such that each pin 4a is accepted by a corresponding through-hole 1b on the printed circuit board 1.

Each through-hole on the printed circuit board 1 carries a metal land, and the pins 3a or 4a that are inserted into the through-holes 1a or 1b are fixed thereto by a solder. The soldering is achieved by dipping the printed circuit board 1 in a molten solder bath (not shown) and pulling up the same subsequently. As the interconnection pins are held firmly in the through-holes, the device of this type is held firmly on the printed circuit board 1 even when a large external force is applied thereto. Thus, this type of device is suitable for the connectors as shown in FIG. 1. Further, the integrated circuits having a very large integration density generally have the PGA structure and cannot use surface mounting technology.

As described above, the soldering of the second type device such as the connector 3 or integrated circuit 4 is achieved by dipping the printed circuit board 1 into the molten solder bath. Alternatively, one has to solder each pin by hand. Thereby, the soldering process of the surface mounting type device cannot be used, as the surface mounting technology uses the heating fixture, not the molten solder bath, for causing the solder to melt. It should be noted that the temperature used to cause the melting of the solder ring is different in the heating fixture and the solder bath. This means that one cannot apply the soldering process for the first type devices 2a-2c of the surface mounting type and the second type devices 3 and that require dipping into the solder bath. In other words, the soldering for the devices 2a-2c has to be done separately from the soldering for the devices 3 and 4. Thus, the conventional electronic devices have suffered from the problem of increased cost associated with the use of two different mounting techniques.

SUMMARY OF THE INVENTION

Accordingly, it is a general object of the present invention to provide a novel and useful mounting device for mounting an electronic device on a substrate by surface mounting technology.

Another and more specific object of the present invention is to provide a mounting device for mounting an electronic device on a substrate such that interconnection pins of the electronic device are fitted into corresponding through-holes on the substrate and fixed thereto by soldering that is achieved simultaneously to the soldering process of the surface mounting technology.

Another object of the present invention is to provide a mounting device for mounting an electronic device on a substrate comprising a plate of an insulating material formed with a plurality of through-holes in correspondence to pins of the electronic device, the pins being adapted to be inserted into corresponding through-holes provided on the substrate, and a plurality of solder rings accommodated into the plurality of through-holes on the plate, wherein each through-hole on the plate of the mounting device has a structure to hold the solder ring therein. According to the present invention, each pin of the electronic device carries a solder ring thereon upon attachment of the mounting device on the electronic device, and the solder ring causes a melting upon passage of the electronic device, thus attached with the mounting device, through a heating fixture that is used to cause the reflow of the solder ring in conventional surface mounting technology. Thereby, one can mount the electronic device having the pins that are designed to be inserted into the corresponding holes of the substrate by passing the electronic device through the heating fixture used for surface mounting technology. As a result of the present invention, the soldering process can be achieved simultaneously for the electronic devices of the surface mounting type and for the electronic devices having the pins inserted into the through-holes of the substrate, and the efficiency of mounting is substantially improved. Associated therewith, one can reduce the cost of the electronic apparatus.

Other objects and further features of the present invention will become apparent from the following detailed description when read in conjunction with the attached drawings.

BRIEF DESCRIPTION OF THE DRAWINGS

FIGS. 2(A) and 2(B) are diagrams showing the essential part of the device of the present invention according to a first embodiment;

FIGS. 3(A)–3(C) are diagrams showing the process of reflowing the solder in the device of FIG. 2;

DETAILED DESCRIPTION OF THE PREFERRED EMBODIMENTS

Figure 1:
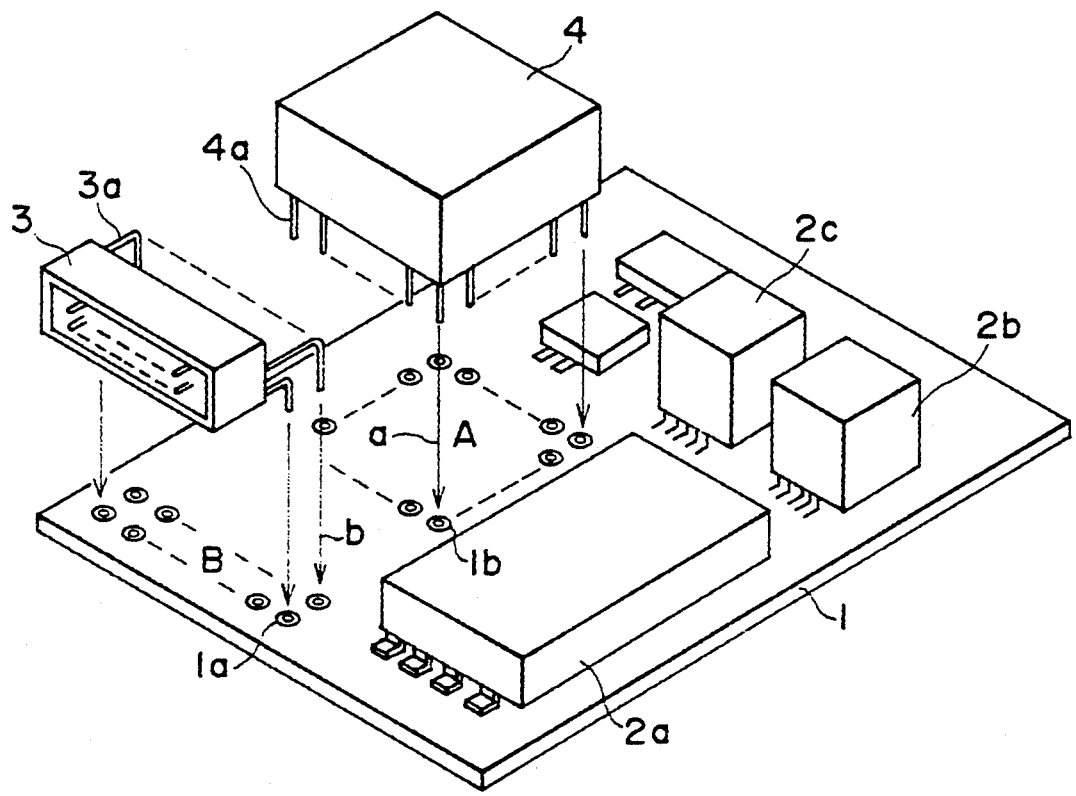
FIG. 1 is a diagram showing a conventional printed circuit board on which various electronic devices are mounted.

FIG. 2 shows the essential part of the device of the present invention according to a first embodiment. In FIG. 2, the parts that correspond to the parts described previously with reference to FIG. 1 are designated by the same reference numerals and the description thereof will be omitted.

Referring to FIG. 2, there is provided a plate 6 of a heat-resistant insulating material such as polyimide, and the plate 6 carries thereon a number of through-holes 6a. FIG. 2(A) shows a state in which the connector 3 is provided on the top surface of the printed circuit board 1 together with the plate 6. As shown in FIG. 2(A), the through-holes 6a are provided in correspondence to each pin 3a of the connector 3, and the pins 3a are inserted into the corresponding through-holes 6a. The pins 3a extend further and are inserted into the through-hole 1a provided on the printed circuit board 1. It should be noted that each through-hole 6a extends from the bottom surface to the top surface of the plate 6, wherein the plate 6 is provided such that the bottom surface of the plate 6 faces the upper major surface of the printed circuit board 1. The through-hole 6a may have a diameter that allows the passage of the pins 3a freely.

Further, as shown in FIG. 2(B) in detail, the plate 6 has a concentric counter-bore 6b for each through-hole 6a at the top surface, and a solder ring 7 is held at the shoulder part of each counter-bore 6b. There, the pin 3a of the connector 3 is passed through the central bore of the solder ring 7 and further through the hole 6a until it emerges at the bottom surface of the printed circuit board 1 through the through-hole 1a. As shown in this cross section, the through-hole 1a carries a metal land 1b extending from the top surface to the bottom surface of the printed circuit board 1. As will be described later in detail, the plate 6 is connected to the body of the connector 3 such that the bottom surface of the plate 6 is substantially flush to the bottom surface of the connector 3 and is contacted to the land 1b at the top surface of the printed circuit board 1. It is needless to say that a metal strip forming an interconnection pattern is provided on one or both of the top and bottom surfaces of the printed circuit board 1, although such a pattern is not explicitly illustrated. Alternatively, it may be understood that the metal land 1b forms a part of such an interconnection pattern.

Thus, the plate 6 and the solder ring 7 forms a mounting device 5 of the present invention that is used for mounting an electronic device on a substrate. In the typical example, the solder ring 7 may have an outer diameter of 1.8 mm that is smaller than the diameter of the counter-bore 6b and an inner diameter of 1 mm. The height of the solder ring 7 depends on the thickness of the counter-bore 6a. Typically, the thickness may be set to about 1 mm in correspondence to the depth of the counter-bore 6b.

FIGS. 3(A)–3(C) show the process for soldering the pin 3a by causing a reflow of the solder ring 7.

In the step of FIG. 3(A), the pin 3a is passed through the solder ring 7 and further through the through-hole 1a. This state corresponds to the state of FIG. 2(B). In other words, the state of FIG. 3(A) corresponds to the state of FIG. 2(A).

Next, the structure of FIG. 2(A) is passed through the heating fixture that is used for the surface mounting technology for causing the reflow of the solder. Thereby, the ring solder 7 starts to melt and causes the reflow as shown in FIG. 3(B). There, the molten solder 7 fills the space between the pin 3a and the wall of the through-hole 1a. After passing through the heating fixture, the structure shogun in FIG. 3(C) is obtained, wherein the solder completely fills the space between the pin 3a and the wall of the through-hole 1a. Typically, a temperature of about 215° C. is used in the heating fixture to cause the reflow of the solder. In order to achieve an effective heating of the solder ring 7, it is preferred to set the thickness d of the plate 6 at the part corresponding to the hole 6a (see FIG. 3(A)) as small as possible. On the other hand, excessively small thickness of this part may tend to invite damage at this part. The thickness d is preferably set to about 0.3 mm.

As will be understood from the above description, the plate 6 and the solder ring 7 enables the mounting of the electronic device having the pins that are inserted into the through-holes of the printed circuit board by the process of surface mounting technology. Thereby, the mounting of the devices such as the devices 3 and 4 can be made simultaneously to the devices 2a–2c that are mounted by the surface mounting technology, and the fabrication cost of the electronic apparatus that uses these electronic devices is significantly reduced.

Figure 4:
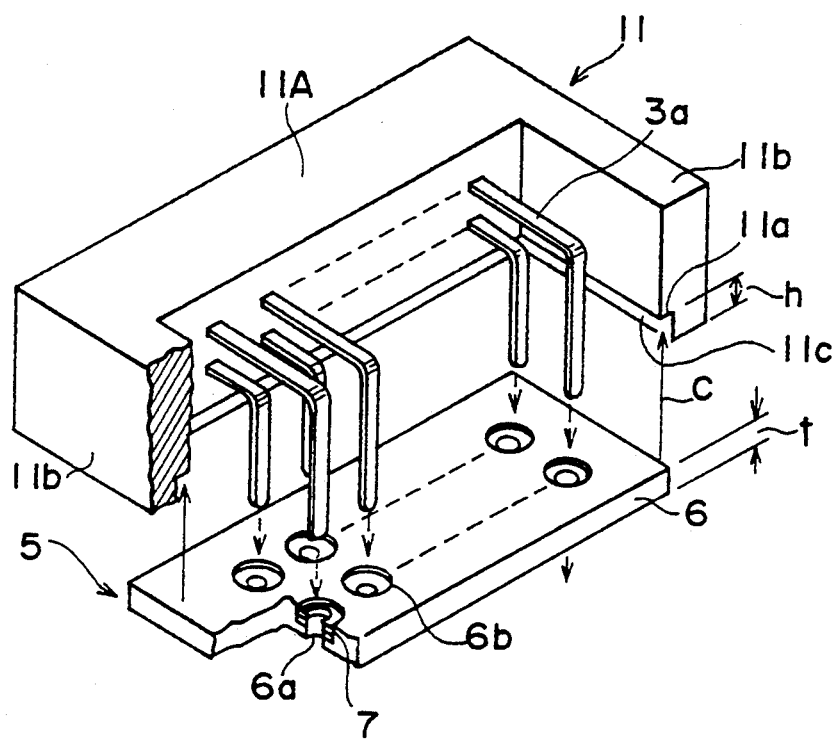
FIG. 4 is a diagram showing the mounting of the device of the first embodiment on a connector that is an example of the electronic device.

FIG. 4 shows the mounting of the device 5 of the present invention on a connector 11 that corresponds to the connector 3 of FIG. 2(A). This process is conducted before the mounting of the connector 3 on the printed circuit board 1.

Referring to FIG. 4, the connector 11 has a main part 11A in which a number of pins 3a are provided similarly to the connector 3 of FIG. 2(A). Thus, each pin 3a is bent at a right angle and has a generally L-shaped form. At both lateral ends of the part 11A, there is provided a guide part 11b and the connector generally has a U-shaped form when viewed from the upward direction of the printed circuit board 1.

Along the bottom edge of the parts 11A and 11b, there is provided a grooved guide region 11c with a height h such that the plate 6 of the device 5 is accepted therein when the plate 6 is attached to the connector body as shown by an arrow C. More specifically, the upper boundary of the guide region 11c is bounded by a step or shoulder part that prevents further insertion of the plate 6 into the guide region 11c. The height h of the guide region is thereby chosen substantially equal to the thickness t of the plate 6.

Before the plate 6 is attached to the connector body 11, the solder ring 7 is of course placed into each counter-bore 6b of the through-hole 6a. Such a mounting of the solder ring 7 is easily achieved by loading a number of solder rings 7 on the top surface of the plate 6 and applying shaking.

Upon attachment to the connector 11, the plate 6 is held by the pins 3a that establish a frictional engagement with the solder rings 7. Further, the plate 6 may be fixed to the connector 11 by adhesives or glue.

Figure 5:
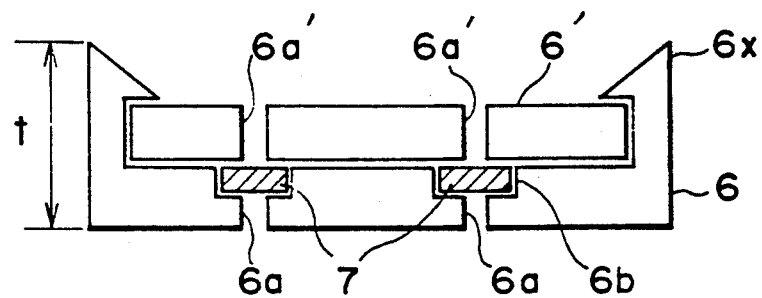
FIG. 5 is a diagram showing a second embodiment of the present invention.

FIG. 5 shows a second embodiment of the present invention for holding the solder ring 7 firmly at the counter-bore 6b when the plate 6 of the mounting device 5 is attached to the connector 11 as shown in FIG. 4.

Referring to FIG. 5, the plate 6 now has a catch part 6x that is formed along the rim of the plate 6. On the top surface of the plate 6, there is provided a cover plate 6' such that the top surface of the cover plate 6' is held by the catch part 6x as illustrated. Further, the cover plate 6' is formed with through-holes 6a' in correspondence to the through-holes 6a of the plate 6 such that the pins 3a of the connector 11 are passed through the through-holes 6a and 6a' consecutively. Further, the catch part 6x has the overall height t that is set equal to the height h similar to the case of FIG. 4.

In this embodiment, the solder ring 7 is held between the plate 6 and the plate 6' contacting thereto. Thereby, the solder ring 7 does not come off from the counter-bore 6b when the device 5 is attached to the connector 11, and the device 5 is held thereto by the frictional engagement between the pin 3a and the solder ring 7.

Figure 6A:
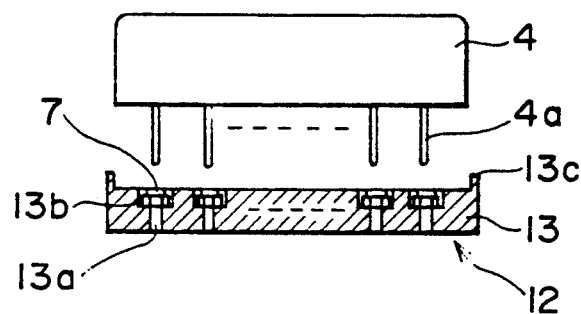
FIGS. 6(A) and 6(B) are diagrams showing the device of the present invention according to a third embodiment.
Figure 6B:
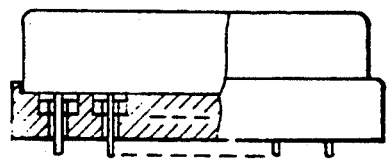

FIGS. 6A and 6B show a mounting device 12 according to a third embodiment of the present invention.

Referring to the drawings, the mounting device 12 includes a plate 13 corresponding to the plate 6. Thus, the plate 13 is provided with a number of through-holes 13a and corresponding counter-bores 13b respectively in correspondence to the through-holes 6a and the counter-bores 6b of the plate 6. Here, the plate 13 is formed to have a shape corresponding to the bottom surface of the integrated circuit 4 of FIG. 1, and the through-holes 13a are formed in correspondence to the pins 4a of the integrated circuit 4. As noted already, the integrated circuit 4 has the PGA structure and has the pins 4a extending downward from the bottom surface of the integrated circuit 4. Further, in order to hold the integrated circuit 4 on the top surface of the plate 13, the plate 13 is formed with a support wall 13c around the rim part thereof to extend in the upward direction. Thereby, the integrated circuit 4 plated on the plate 13 is supported laterally by the support wall 13c as shown in FIG. 6(B).

In this embodiment, too, the reflowing process for causing the melting of the solder ring 7 can be achieved by passing the structure of FIG. 6(B) thorough the heating fixture for the surface mounting process, and the mounting of the PGA integrated circuit 4 can be achieved simultaneously with the mounting of the surface mounting type devices 2a–2c of FIG. 1. Thereby, the fabrication cost of the electronic apparatus can be significantly reduced.

Further, the present invention is not limited to the embodiments described heretofore, but various variations and modifications may be made without departing from the scope of the invention.

What is claimed is:

1. A mounting device for mounting an electronic device on a substrate, the electronic device having a plurality of interconnection pins for electrical interconnection to said substrate, said mounting device comprising:
    a plate member of an insulating material having upper and lower major surfaces, the interconnection pins of the electronic device being connected to the substrate through said plate member, said lower major surface of said substrate being formed so as to be mounted upon an upper major surface of said substrate;
    a plurality of counter-bores defined on the upper major surface of said plate member in correspondence to the plurality of interconnection pins of the electronic device, each of said plurality of counter-bores having a first diameter and a bottom surface at a level below the upper major surface of said plate member;
    a plurality of through-holes defined on said plate member in correspondence to each of said plurality of counter-bores, each of said plurality of through-holes being further defined concentric to a counter-bore corresponding thereto and having a second diameter that is smaller than the first diameter, each of said plurality of through-holes extending from the bottom surface of the corresponding counter-bore to the lower major surface of said plate member;
    a plurality of solder rings positioned in said plurality of counter-bores; and
    holding means provided on the upper major surface of said plate member for holding said plurality of solder rings in said corresponding counter-bores such that said solder rings do not come off from said counter-bores.

2. A mounting device as claimed in claim 1, wherein each of said plurality of solder rings has an outer diameter set to be accepted into a corresponding counter-bore on said plate member, each of said plurality of solder rings further having an inner diameter for allowing passage of a corresponding interconnection pin of the electronic device.

3. A mounting device as claimed in claim 2, wherein the inner diameter of each of said plurality of solder rings is set to establish a frictional engagement with the corresponding interconnection pin of the electronic device.

4. A mounting device as claimed in claim 1, wherein each of said plurality of counter-bores has a depth, measured from the upper major surface of said plate member to the bottom surface of the counter-bore, that is set smaller than a height of a corresponding solder ring.

5. A mounting device as claimed in claim 1, wherein said holding means comprises:
    a cover plate having upper and lower major surfaces and positioned on the upper major surface of said plate member for holding said plurality of solder rings accommodated in corresponding counter-bores between said bottom surface of said counter-bore and said lower major surface of said cover plate, said cover plate having defined thereon a plurality of through-holes located in correspondence to the interconnection pins of the electronic device so as to allow passage of the interconnection pins therethrough.

6. A mounting device as claimed in claim 1, wherein said plate member includes catch means for catching the cover plate that is provided on the upper major surface of said plate member.

7. A mounting device as claimed in claim 6, wherein the catch means includes a catch that is formed around a rim of said plate member.

8. A mounting device as claimed in claim 1, wherein said plate member includes mounting means for mounting said plate member to the electronic device.

9. A mounting device as claimed in claim 8, wherein the mounting means includes a side wall extending in an upward direction and formed in conformity with a shape of the electronic device.

10. A mounting device as claimed in claim 1, wherein the electronic device includes a connector.

11. A mounting device as claimed in claim 1, wherein the electronic device includes an integrated circuit.

12. An electronic circuit device, comprising:
a substrate having upper and lower major surfaces, said substrate having a plurality of through holes defined therein to extend from the upper major surface to the lower major surface, and an interconnection pattern connected to the through holes;
an electronic device having a plurality of interconnection pins for external connection; and
a bracket including a plate member of an insulating material having upper and lower major surfaces, a plurality of counter-bores provided on the upper major surface of the plate member in correspondence to the plurality of interconnection pins of said electronic device, each of the counter-bores having a first diameter and a bottom surface at a level below the upper major surface of the plate member, a plurality of through-holes defined on the plate member in correspondence to each of the counter-bores, each of the through-holes being defined concentric to a counter-bore corresponding thereto and having a second diameter that is smaller than the first diameter, each of the through-holes extending from the bottom surface of the corresponding counter-bore to the bottom surface of the plate member, a plurality of solder pieces located in the plurality of counter-bores and holding means provided on the upper major surface of said plate member for holding said plurality of solder rings in said corresponding counter-bores such that said solder rings do not come off from said counter-bores,
said electronic device being attached to said bracket by the interconnection pins that are inserted into the corresponding through-holes on the plate member,
said bracket being attached to said substrate by the interconnection pins that are inserted into the corresponding through-holes on said substrate via the through-holes on the plate member,
said electronic device and said bracket being connected to said substrate by reflowed solder pieces thereby connecting the interconnection pins to the interconnection pattern.

13. A method for mounting an electronic device having a plurality of interconnection pins on a substrate, comprising the steps of:
selecting a bracket that incorporates a plate member of an insulating material having upper and lower major surfaces, a plurality of counter-bores provided on the upper major surface of the plate member in correspondence to the plurality of interconnection pins of the electronic device, each of the counter-bores having a first diameter and a bottom surface at a level below the upper major surface of the plate member, a plurality of through-holes defined on the plate member in correspondence to each of the counter-bores, each of the throughholes being further defined concentric to a counter-bore corresponding thereto and having a second diameter that is smaller than the first diameter, each of the through-holes extending from the bottom surface of the corresponding counter-bore to the bottom surface of the plate member, and a plurality of solder pieces provided on the plurality of counter-bores;
providing holding means on the upper major surface of said plate member for holding said plurality of solder rings in said corresponding counter-bores such that said solder rings do not come off from said counter-bores;
attaching the electronic device to the bracket, said step of attaching the electronic device to the bracket including a step of inserting the interconnection pins of the electronic device into corresponding through-holes on the plate member;
attaching the electronic device and the bracket to which the electronic device is attached, to the substrate, the substrate having a plurality of through-holes and an interconnection pattern connected to the through-holes, said step of attaching the electronic device including a step of inserting the interconnection pins of the electronic device into the corresponding through-holes on the substrate via the through-holes on the plate member; and
causing a reflowing of the solder ring by applying heat.

14. A mounting device as claimed in claim 12, wherein said electronic device includes a connector.

15. A mounting device as claimed in claim 12, wherein said electronic device includes an integrated circuit.

* * * * *